(12) United States Patent
Liu-Barba et al.

(10) Patent No.: US 6,655,898 B1
(45) Date of Patent: Dec. 2, 2003

(54) FRONT OPENING UNIFIED POD (FOUP) HOIST JIG

(75) Inventors: David Liu-Barba, Rocklin, CA (US); Simon Tong, San Francisco, CA (US)

(73) Assignee: NEC Electronics, Inc., Santa Clara, CA (US)

( * ) Notice: Subject to any disclaimer, the term of this patent is extended or adjusted under 35 U.S.C. 154(b) by 164 days.

(21) Appl. No.: 10/014,765

(22) Filed: Dec. 11, 2001

(51) Int. Cl.[7] ............................................. B65G 49/07
(52) U.S. Cl. ........................ 414/673; 414/935; 414/940; 187/404
(58) Field of Search ................................ 414/673, 935, 414/940; 187/404

(56) References Cited

U.S. PATENT DOCUMENTS 940,065 A * 11/1909 Richmond .............. 414/673 X
3,472,342 A * 10/1969 Wuesthoff ............... 187/404 X

FOREIGN PATENT DOCUMENTS

DE 2041995 * 3/1972 ................. 187/404
RU 937309 * 6/1982 ................. 187/404

OTHER PUBLICATIONS

*Overhead Handling Versus PWP F300 and AutoPod™ Wafer Carrier*, EFIX, Apr. 2000; 2 pages. (Copy Enclosed).

* cited by examiner

*Primary Examiner*—Steven A. Bratlie
(74) *Attorney, Agent, or Firm*—Campbell Stephenson Ascolese LLP

(57) ABSTRACT

An apparatus and method for simultaneously cycle-testing two wafer storage containers is provided. The two wafer containers are maintained in a counterbalance relationship to each other and cycled in a vertical up-and-down motion to simulate the forces of a selected overhead transport system.

22 Claims, 10 Drawing Sheets

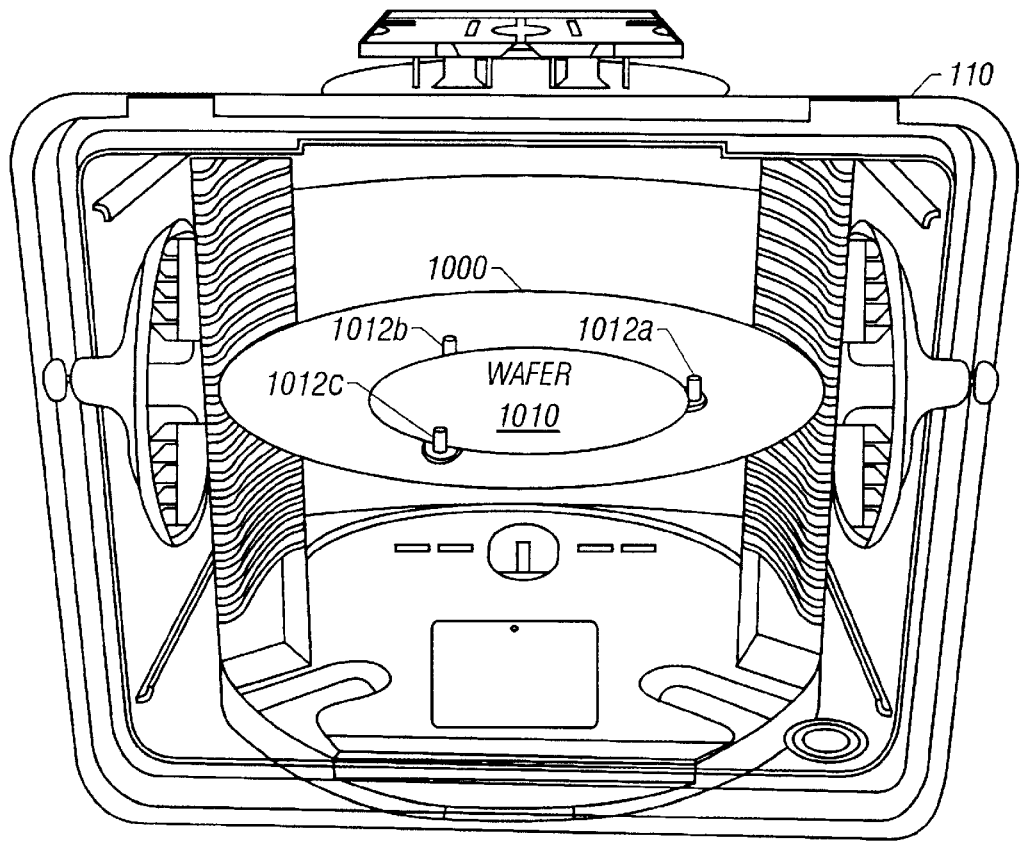
FIG. 10
| FIG. 11a |
|----------|
| FIG. 11b |
FIG. 11
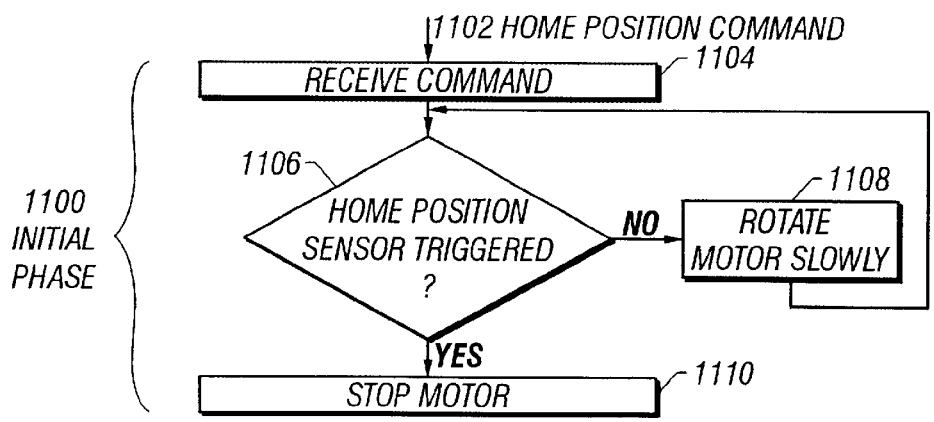
FIG. 11a

FRONT OPENING UNIFIED POD (FOUP) HOIST JIG

BACKGROUND OF THE INVENTION

1. Field of the Invention

The present invention relates to machinery used to test containers for wafer cassettes and, more particularly, relates to a hoist jig that repeatedly cycles two wafer containers, such as front opening unified pods, in order to simulate the vertical forces exerted by a selected overhead transport system.

2. Description of the Related Art

In the manufacturing process of semiconductor wafers, different-sized wafers require cassettes having different dimensions. Many current production lines use 150 mm and 200 mm diameter wafer; next generation lines will use 300 mm wafers. Therefore, next generation equipment has been designed to accommodate 300 mm wafers. One type of such equipment is wafer-storage cassettes.

Wafer transfer systems are used to provide an automated transfer of semiconductor wafers from one position to another position. For example, the wafers contained in a cassette may be moved individually to a processing chamber for depositing and patterning layers of material for forming integrated circuit chips. Robotic handling devices are preferred, since human handling is more likely to cause contamination.

The wafer-storage cassettes are often themselves stored and transferred in a pod. One type of wafer storage pod is referred to as a Standardized Mechanical InterFace (SMIF) pod. A SMIF pod is described in U.S. Pat. No. 5,653,565, which is assigned to Bonora et al. and is incorporated by reference herein in its entirety. The SMIF pod includes a cover that mates with a door to provide a sealed environment for the wafers within the cassette. When the wafers are to be transferred to a processing station, the pod is placed onto an access port of a transfer system such that the pod door is in contact with the access port.

Another type of wafer storage pod is sometimes referred to in the industry as a Front Opening Unified Pod (FOUP). A FOUP has an access door located on a side that is perpendicular to horizontally stored wafers and is used for 300 mm diameter semiconductor wafers. Automated transfer systems for use with FOUPs have been designed. FOUPs are designed to be lifted and lowered by automated material handling systems (AMHS), such as overhead hoist transport (OHT) systems. OHT systems result in mechanical wear of the FOUP due to repeated lifting and lowering.

SUMMARY OF THE INVENTION

A hoist jig comprises a vertically upright center member having a first surface and a second surface and a base coupled to the center member. The hoist jig further comprises a first support arm and a second support arm. The first support arm is coupled in a vertically slideable relationship to the first surface of the center member, the first support arm being configured to receive a first wafer storage container. The second support arm is coupled in a vertically slideable relationship to the second surface of the center member, the second support arm being configured to receive a second wafer storage container. The hoist jig further comprises a cycle mechanism that is operable to cycle the first wafer storage container and the second wafer storage container in a vertical up-and-down motion. The cycle mechanism is further operable to maintain the first wafer storage container and the second wafer storage container in a counterbalanced relationship with each other.

A method of testing two wafer containers simultaneously comprises coupling a first wafer container to a first support arm, wherein the first support arm is coupled to a first surface of a center member. The method further comprises coupling a second wafer container to a second support arm, wherein the second support arm is coupled to a second surface of a center member. The method further comprises maintaining the first wafer container and the second wafer container in a counterbalanced relationship with each other. The method further comprises cycling the first wafer container and the second wafer container in a vertical up-and-down motion at a speed that simulates the vertical forces exerted by a selected automated material handling system.

BRIEF DESCRIPTION OF THE DRAWINGS

The present invention may be better understood, and its numerous objects, features, and advantages made apparent to those skilled in the art by referencing the accompanying drawings.

FIG. 10 is a diagram of a wafer adapter that may be employed within a 300 mm FOUP to retain 150 mm wafers.

FIG. 11A is a flow chart illustrating an initial phase of a method of performing cycle testing using a FOUP hoist jig.

DETAILED DESCRIPTION

The following sets forth a detailed description of a mode for carrying out the invention. The description is intended to be illustrative of the invention and should not be taken to be limiting.

In a test environment, mechanical wear on a FOUP can be observed to predict the life expectancy of the FOUP in a particular manufacturing environment. For example, mechanical wear on a FOUP that will be produced by a particular OHT system can be simulated in the testing environment. Such testing may include "cycle testing"—repeatedly lifting and lowering the FOUP to the height that the FOUP would be lifted to in the OHT system.

An OHT system, being an overhead system, lifts a FOUP from a first piece of fab machinery to a specific overhead height associated with the OHT system. The FOUP is transported via an overhead monorail-type transport system to a second piece of machinery. The OHT system then lowers the FOUP from the overhead transport system to the second piece of machinery. In order to simulate the mechanical forces applied to a FOUP by an OHT system, the hoist jig described herein simulates the height differential between fab machines and the OHT system, and further simulates the rate at which a particular OHT system lifts the FOUP. Prior art devices that lift the FOUP at an arbitrary rate that is not associated with a particular OHT system does not meet this objective. Similarly, a prior art device that lifts the FOUP to an arbitrary height not associated with the particular OHT system also fails to meet this objective.

Figure 1:
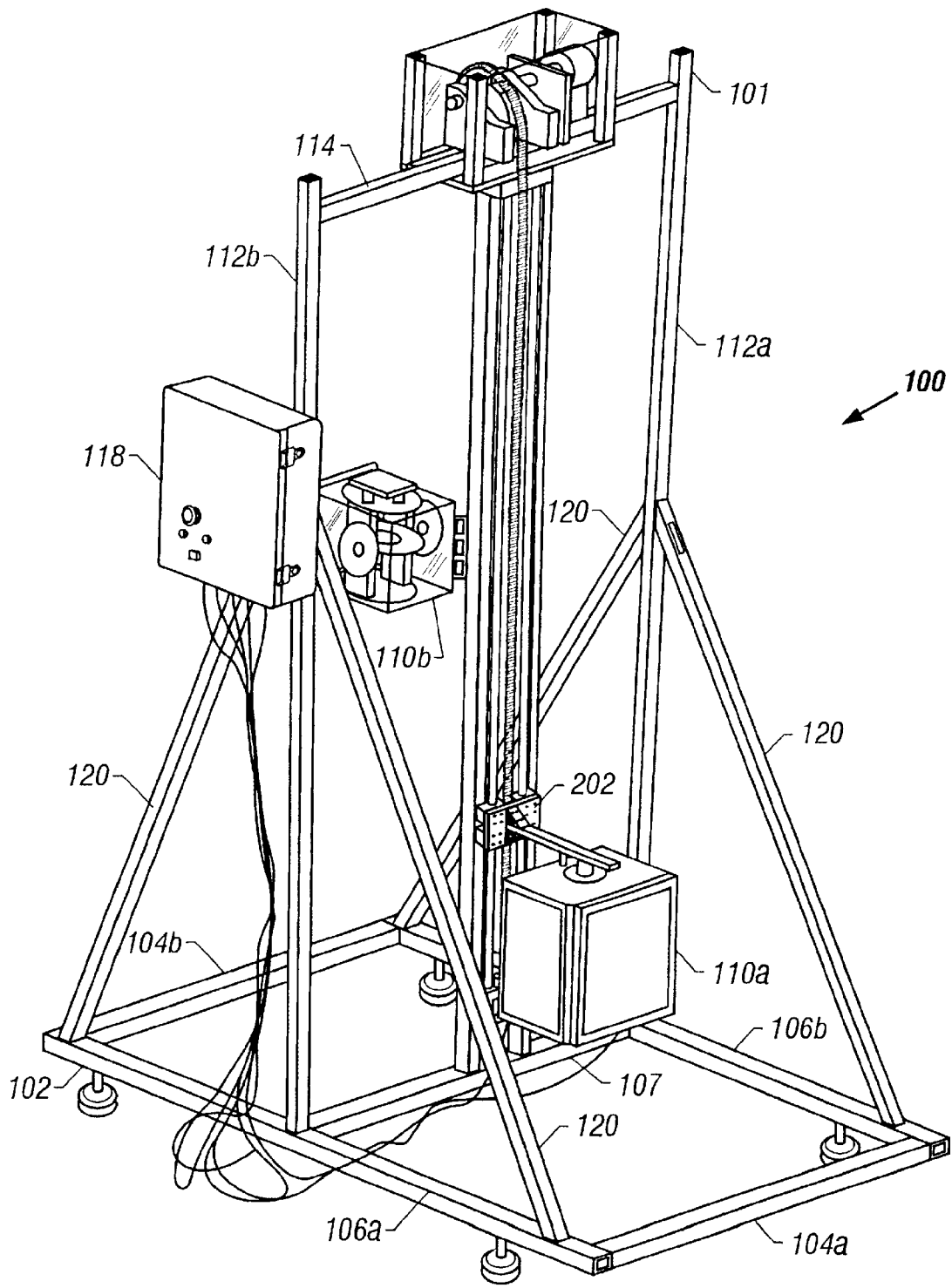
FIG. 1 is a plan view of a FOUP hoist jig.
Figure 2:
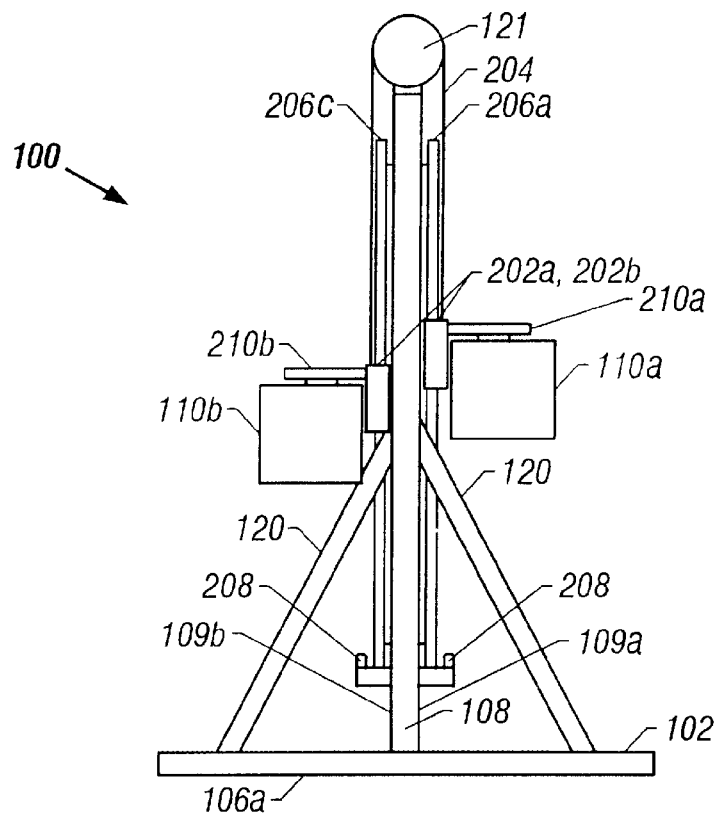
FIG. 2 is a side view of a FOUP hoist jig.
Figure 3A:
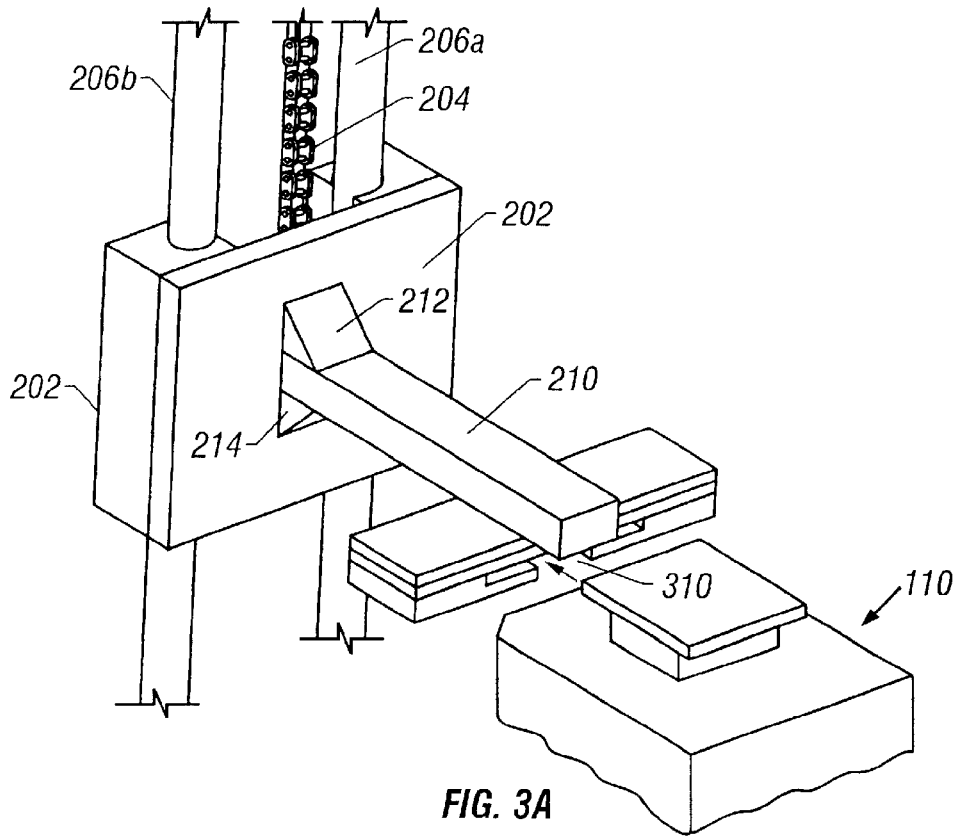
FIG. 3A is an expanded side view of a pillow block and linear guides of a FOUP hoist jig.
Figure 3B:
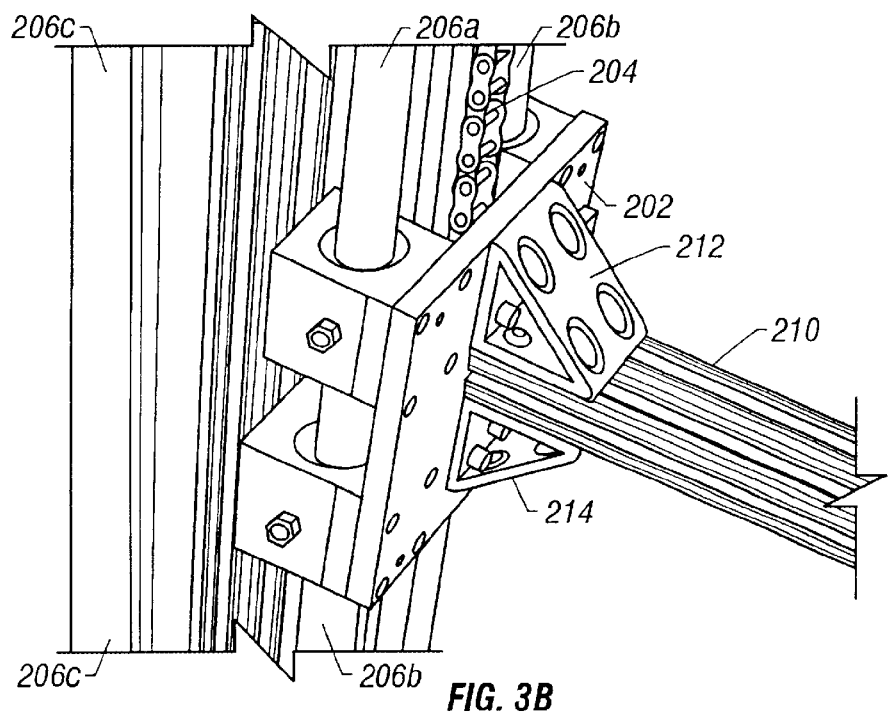
FIG. 3B is an expanded side view of a pillow block and linear guides of a FOUP hoist jig.
Figure 4:
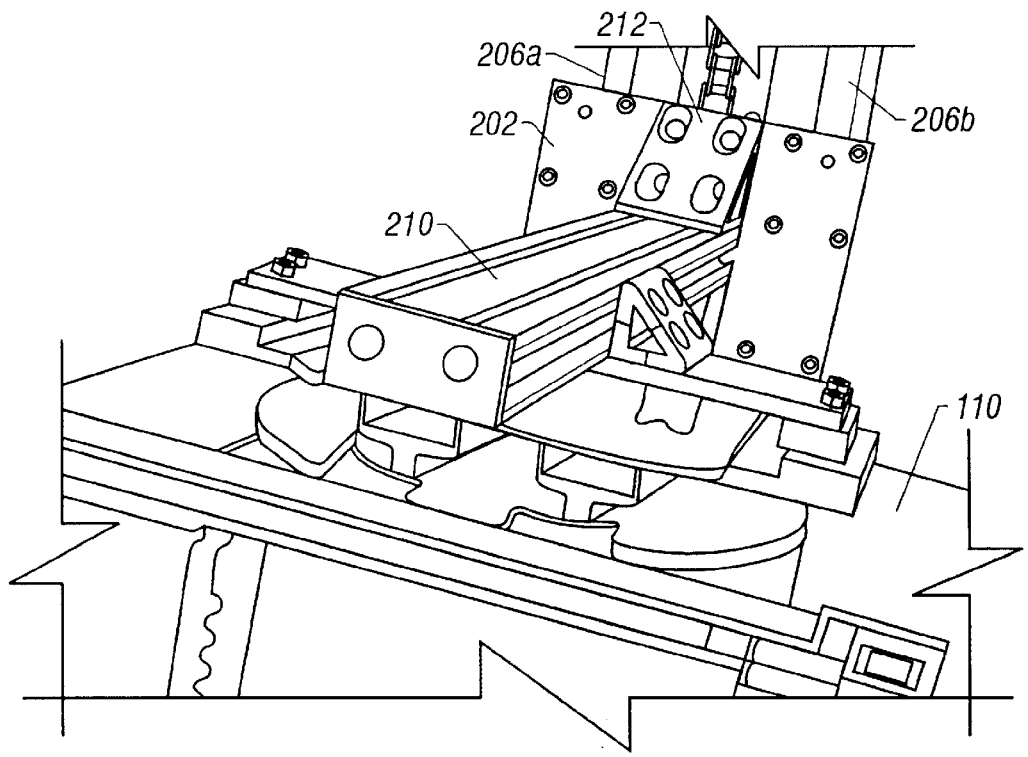
FIG. 4 is an expanded front view of a pillow block, support arm, and linear guide of a FOUP hoist jig.

Illustrated in FIGS. 1 and 2 is a FOUP hoist jig 100 that meets the objective of simulating the mechanical forces applied to a FOUP by a particular OHT system. In addition, other features of a FOUP's performance can be monitored in a test environment when it is cycle tested on the hoist jig 100. For instance, by placing wafers inside the FOUP 110 and then lifting and lowering the FOUP 110, resultant particles on the wafers can be monitored. In this manner, the sealing integrity of the FOUP 110 against a "bellows effect" can be tested. With information supplied during testing with the hoist jig 100, the life expectancy and integrity of various FOUP models can be evaluated for a particular OHT system. Such evaluations can aid, for example, in a purchasing selection among a plurality of FOUP vendors.

FIGS. 1 and 2 illustrate a FOUP hoist jig 100 that is configured to simultaneously test two FOUPs 110a, 110b. The lift/lower velocity curve of the hoist jig 100 is adjustable, allowing for simulation of acceleration and forces associated with various OHT systems.

The hoist jig's 100 ability to repeatedly lift and lower two FOUPs simultaneously provides distinct advantages over prior art systems that do not provide such dual-testing capability. One such advantage is that two FOUP units are subjected to exactly the same forces during testing, allowing for comparison of two FOUP units that have undergone exactly the same mechanical stresses. This advantage is particularly useful when comparing the performance of two FOUP units manufactured by different respective vendors. Another advantage of the dual-testing capability is the ability to test twice as many FOUP units in a given amount of time. The ability to test two FOUPs simultaneously therefore reduces the testing time required to test a given number of FOUPs.

FIGS. 1 and 2 illustrate that the hoist jig 100 includes a center member 108 and a base 102. The base 102 includes two side members 106a, 106b and two end members 104a, 104b. The side members 106a, 106b are configured in a parallel relationship with each other. The end members 104a, 104b are also configured in a parallel relationship to each other. The side members 106a, 106b are perpendicular to the end members 104a, 104b. Parallel to the end members 104a, 104b and perpendicular to the side members 106a, 106b is a lower crossbar member 107 spaced equidistantly between the end members 104a, 104b. One skilled in the art will recognize that the base 102 may instead be any structure, including and integrally formed one-piece base, that is configured to support the center member 108 in an upright position.

A first upright member 112a and a second upright member 112b form the outer edges of an upright frame 101 that is coupled to the base 102. The lower cross-bar member 107 and an upper cross-bar member 114 are coupled to the upright members 112a, 112b in order to form the rectangular-shaped frame 101. Additional support members 120 are coupled between the base 102 and the frame 101 in order to provide additional support for the frame 101 and keep it in an upright (vertical) orientation. One skilled in the art will recognize that the main objective of the base 102 and frame 101 is to support the center member 108 in an upright vertical position so that it can perform cycle testing on FOUP units 110a, 110b to simulate the forces applied to the FOUPs 110a, 110b by an OHT system. As long as this objective is achieved, any manner of variations of the base 102 and the frame 101 are possible. For instance, the frame 101 need not necessarily be rectangular in shape. Furthermore, the frame 101 may be stabilized in an upright position by any means that provides for maintaining the frame 101 in an upright position—the additional support members 120 are merely one embodiment of such a stabilization means.

FIGS. 1, 2, 3A, 3B, and 4 illustrate that a pair of guide rails 206 are mounted to each of a first surface 109a and second surface 109b of the center member 108. In a preferred embodiment, the guide rails 206 are cylindrical stainless steel members and are mounted to the center member 108 via traditional bolts. The hoist jig 100 also includes pillow blocks 202a, 202b mounted in a slideable relationship with a pair of the guide rails 206a, 206b. The pillow blocks 202a, 202b are configured such that one FOUP 110 can be mounted to each pillow block 202. In at least one embodiment, the guide rails 206 are linear to allow for smooth vertical linear motion of the pillow blocks 202a, 202b as they move in a vertical path along the guide rails 206. In this manner, the two FOUPs 110a, 110b provide counterweight for each other. A preferred embodiment of the guide rails 206a, 206b, 206c, 206d and pillow blocks 202a, 202b are marketed as model 2DA-12-JOB L72 by Thomson Industries, Inc. in Port Washington, N.Y.

Figure 5:
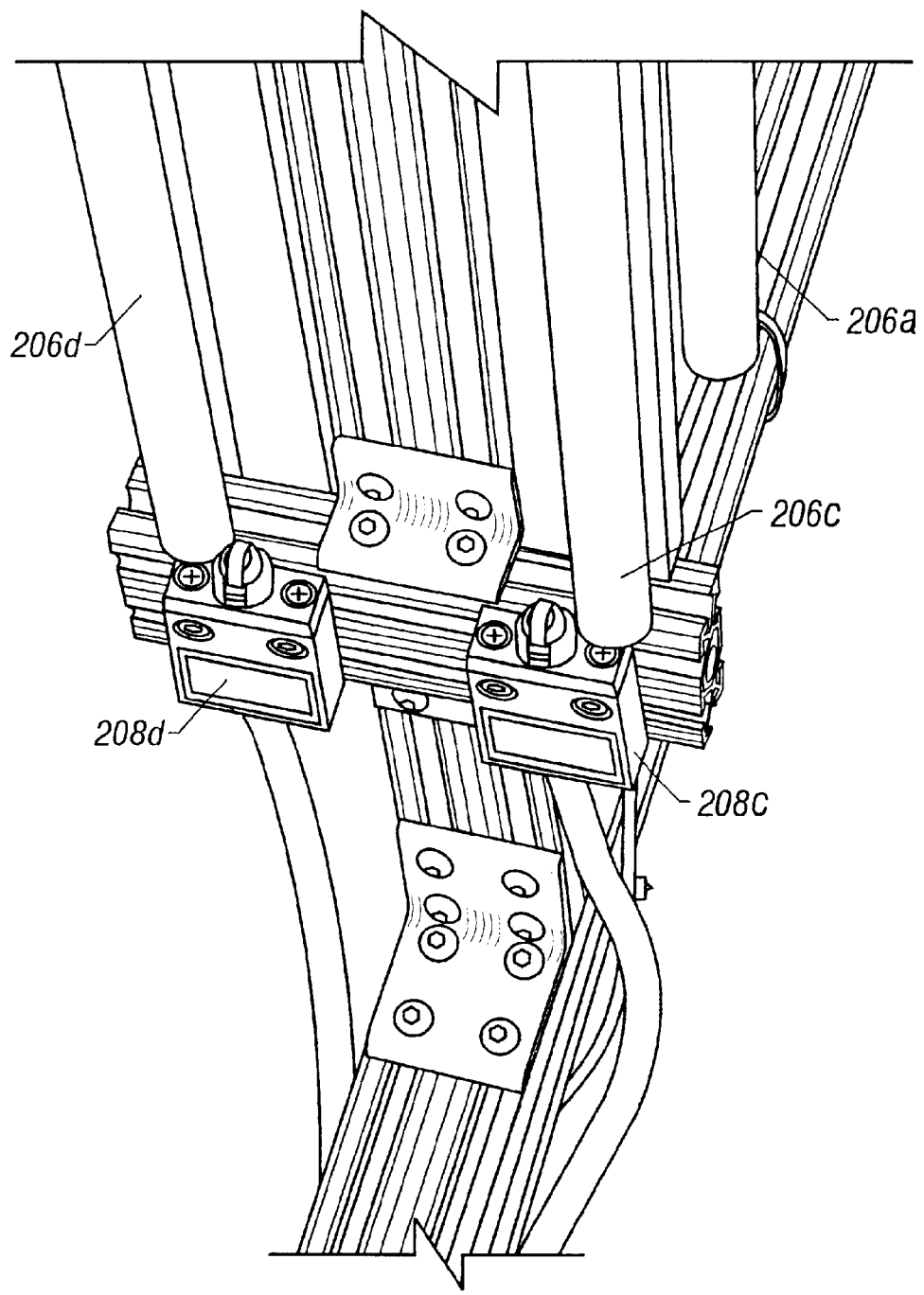
FIG. 5 is an expanded top view of limit switches on a FOUP hoist jig.
Figure 6:
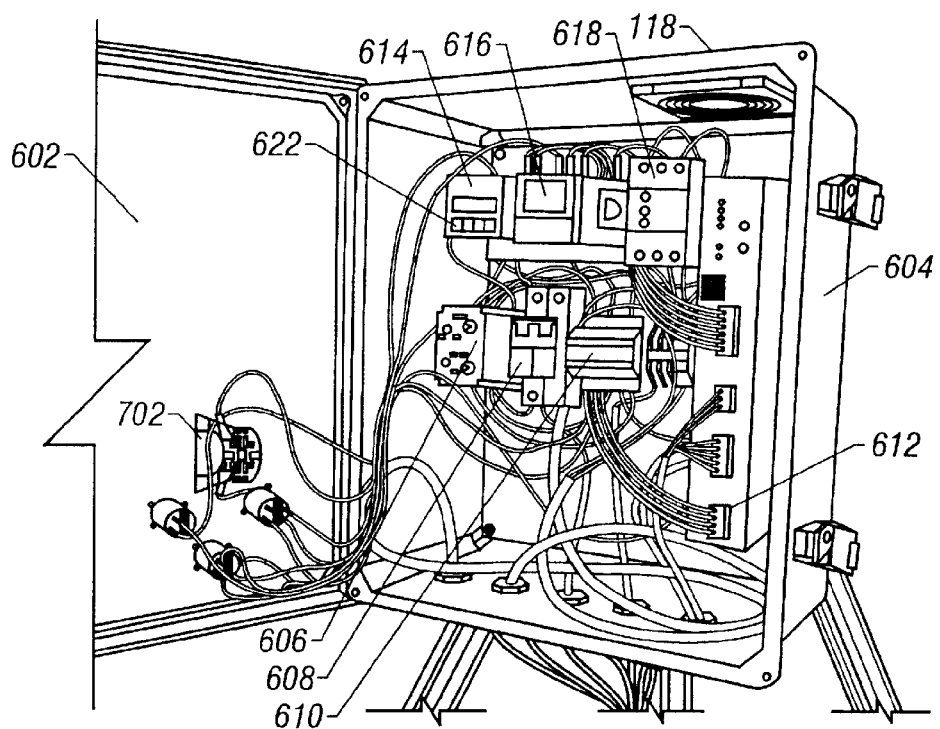
FIG. 6 is an interior view of a control box of a FOUP hoist jig.

FIGS. 1 and 5 illustrate that a limit switch 208a, 208b is mounted at or near the base of each guide rail 206 in order to physically prevent the pillow block 202 from sliding off the linear guide rail 206 in the case of malfunction or mis-operation. As used herein, the "base" of a guide rail 206 indicates a portion of the guide rail at or near the end of the guide rail 206 that is closest to the base 102 (the other end of the guide rail 206 being closer to the upper cross-bar member 114). When any limit switch 208 is activated, power to the motor 121 is removed. In a preferred embodiment, the limit switch 208 is a slim enclosed pre-wired limit switch, such as the D4C limit switch produced by OMRON Corporation with North American headquarters in Schaumburg, Ill.

FIGS. 1, 3A, 3B, 4 and 5 illustrate that a support arm 210 is coupled to each pillow block 202. The point of coupling between the support arm 210 and the pillow block 202 may be fortified with supporting members 212, 214. The support arm 210 is configured to form an aperture 310 into which a portion of a FOUP 110 may be slideably installed. The aperture 310 is sized and shaped to form a friction hold on the installed FOUP 110. Furthermore, screws in the aperture are tightened to keep the FOUP 110 in place.

Figure 8A:
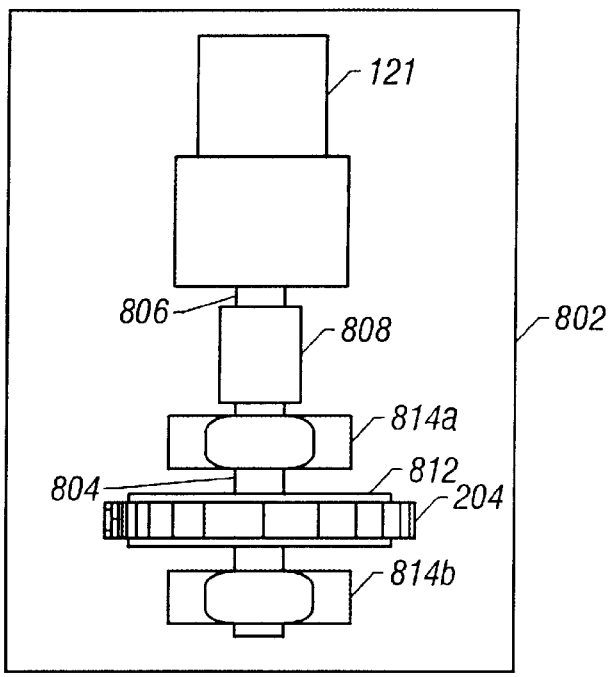
FIGS. 8A and 8B illustrate a top view of a motor and chain assembly of a FOUP hoist jig.
Figure 8B:
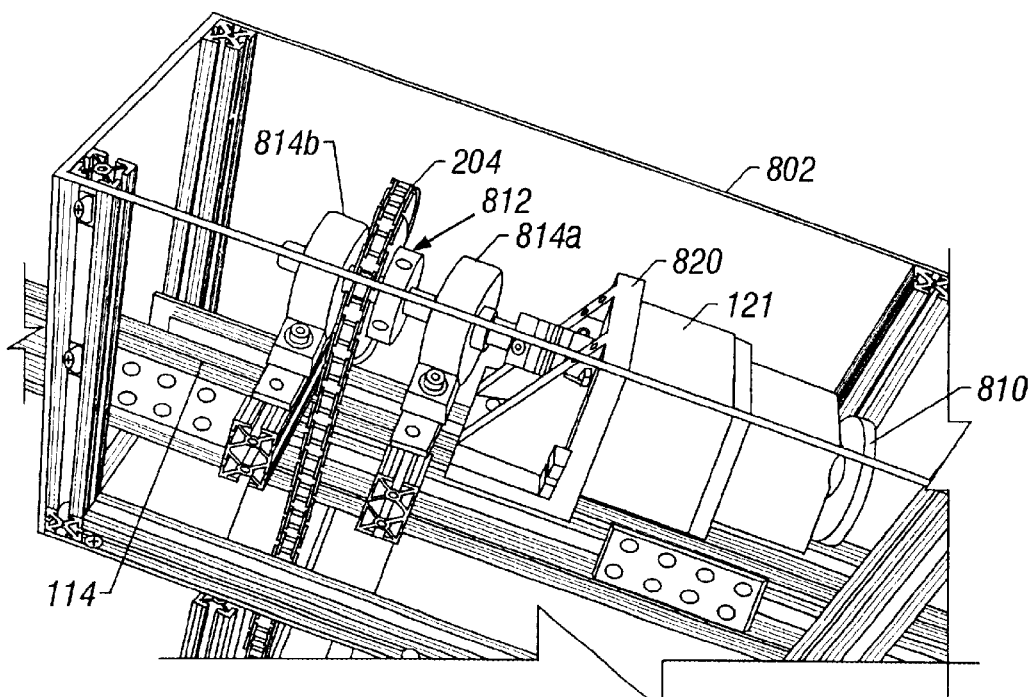
Figure 8C:
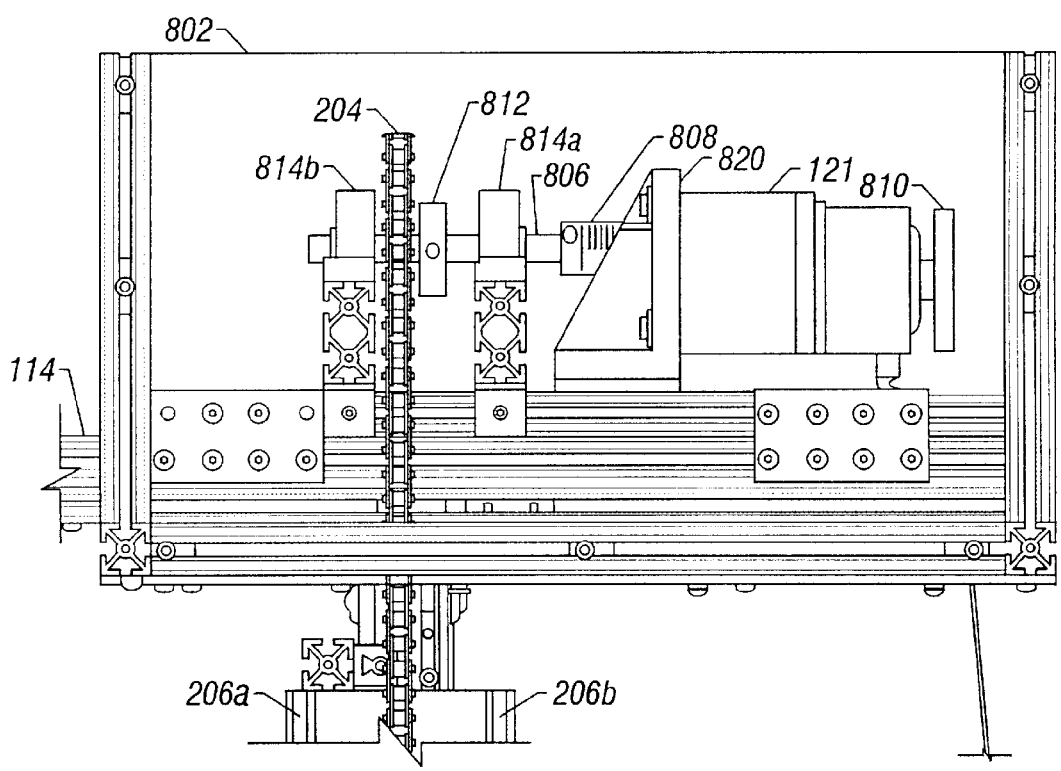
FIG. 8C illustrates a side view of a motor and chain assembly of a FOUP hoist jig.
Figure 9:
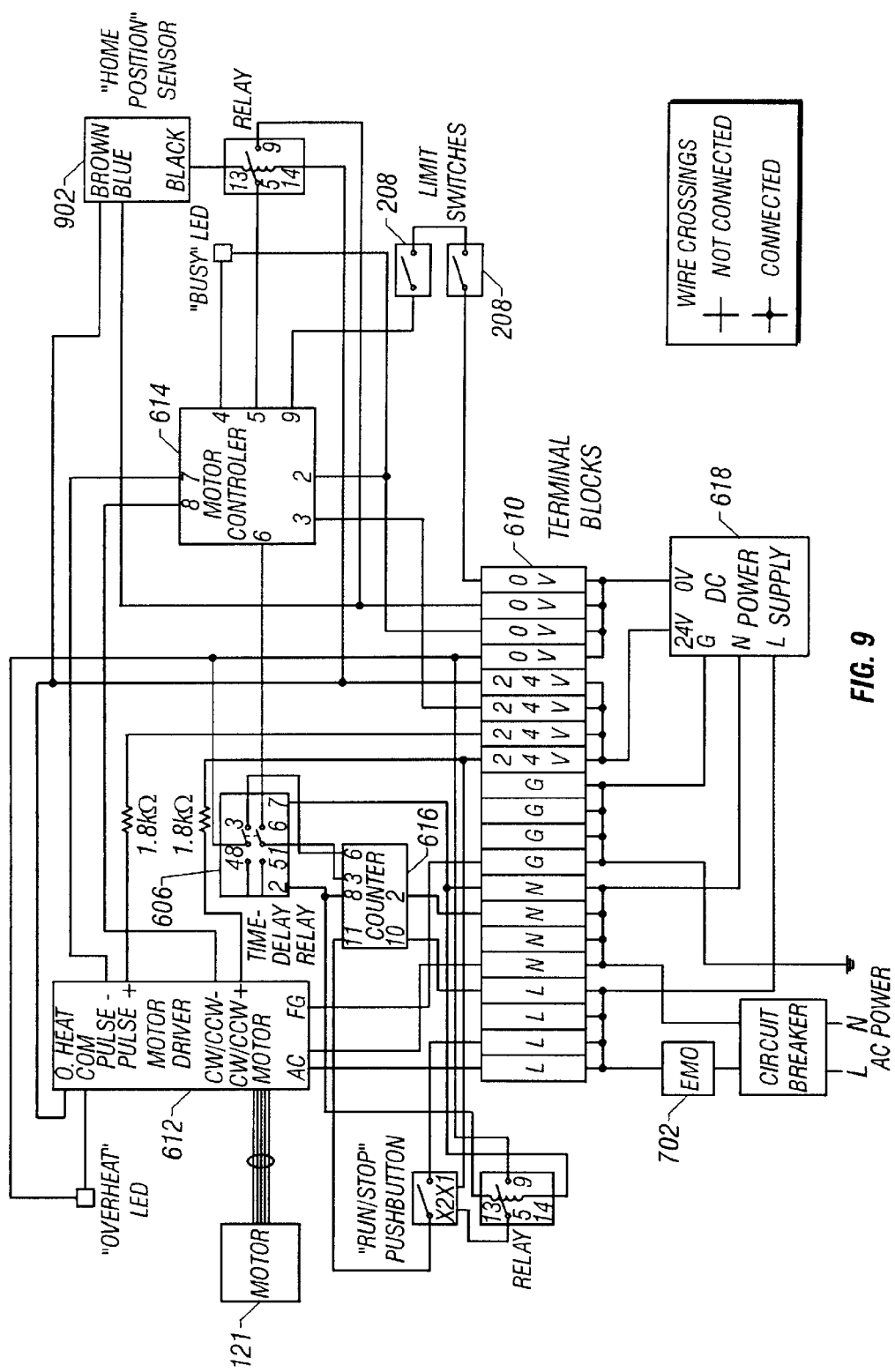
FIG. 9 is a schematic illustrating a motor control circuit for a FOUP hoist jig.

FIGS. 1 and 8, including FIGS. 8A, 8B, and 8C, illustrate that the hoist jig 100 includes a motor 121. In at least one embodiment, the motor 121 is a stepper motor that requires pulses rather than DC current. In a preferred embodiment, the motor 121 is a five-phase stepping motor that allows for higher holding torque, has higher precision, and is easier to control than a standard AC or DC motor. In a preferred embodiment, the motor 121 comprises the PK596BUA stepper motor marketed by Oriental Motor U.S.A. Corporation in Torrance, Calif. The motor 121 includes a motor shaft 806 that rotates when the motor is in operation. The motor shaft 806 is coupled to a drive shaft 804 by a flexible motor coupling 808. The motor coupling 808 couples the motor shaft 806 to the drive shaft 804 and operates to reduce backlash and compensate for misalignment between the two shafts 804, 806. In a preferred embodiment, the motor coupling 808 is a flexible coupling bearing part number CO80S-9 and marketed by Berg, Inc. in Shreveport, La.

The motor 121 operates to drive a drive shaft 804 which, in turn, operates to ultimately raise and lower the FOUPs 110a, 110b. This raise/lower action is facilitated through the operation of a sprocket wheel 812 and chain 204 mounted to the drive shaft 806. Two shaft bearings 814a, 814b further facilitate the raise/lower rotational movement. The mounted shaft bearings 814a, 814b are mounted on the drive shaft 806 and allow the drive shaft 806 to rotate freely with little friction. In a preferred embodiment, the shaft bearings 814a, 814b are stainless steel with low particulation, such as part number 6357K12 marketed by McMaster-Carr Supply Company in Chicago, Ill. A motor damper 810 mounted on the drive shaft 806 absorbs motor shaft vibration. In a preferred embodiment, the motor damper 810 is model number D9CL-12.7 marketed by Oriental Motor U.S.A. Corporation in Torrance, Calif. A motor mount 820 serves to secure the motor 121 to the upper cross-bar member 114.

FIGS. 1, 6, 7, and 9 are referred to for a discussion of control circuitry that supplies power and controls operation of the motor 121. The motor 121 is driven, in at least one embodiment, by a motor driver 612. A preferred embodiment of the motor driver 612 is marketed as part number UDK5114NA by Oriental Motor U.S.A. Corporation in Torrance, Calif. The motor driver receives pulses ("pulse –," "pulse +") from a motor controller 614, which indicates the desired speed of operation of the motor 121. The motor driver 612 also receives a direction signal ("CW/CCW –," "CW/CCW +") from the motor controller 614. Using these inputs, the motor driver 612 drives the five phases of the stepping motor 121.

The motor controller 614 allows the speed and acceleration with which the FOUPs 110a, 110b under test are lifted and lowered to be adjusted. The variability of speed, direction, and torque of the motor 121 are user-controlled via a push-button interface 622 on the motor controller 614. The motor controller 614 sends signals to the motor driver 612 in order to control the speed and direction of the motor 121. The desired velocity profile (speed, acceleration, duration) of the up and down cycles to be performed by the hoist jig 100 are programmed by a user into the motor controller 614 via the push-button interface 622. This variability in operation of the motor 121 provides that the hoist jig 100 is adjustable to simulate parameters, such as lift/lower velocity and acceleration, of various different OHT systems.

The control circuitry of the hoist jig 100 further includes a counter 616. The counter 616 is used to track the number of cycles that have been performed by the hoist jig 100 during a particular test session. When the desired number of cycles has been performed, the counter 616 causes power to be removed from the motor 121 with the result that the hoist jig 100 ceases operation. A preferred embodiment of the counter 616 marketed as model H8CA-S by OMRON Corporation with North American headquarters in Schaumburg, Ill.

A DC power supply 618 provides DC power to those components of the control circuitry that require it, such as the motor controller 614, motor driver 612, and limit switches 208. A preferred embodiment of the DC power supply 618 provides 7.5 W power and is marketed as model PS5R-A24 by Idec Corporation (USA) in Sunnyvale, Calif.

A time-delay relay 606 sends a signal at regular, adjustable intervals to the motor controller 614 to start each cycle. A preferred embodiment of the time-delay relay 606 is marketed as model TR-65122 by Macromatic Controls, LLC, in Milwaukee, Wis.

An emergency off (EMO) button 702, when depressed, removes power to the motor 121. A preferred embodiment of the EMO button 702 is marketed as model HA1B-V2ER by Idec Corporation (USA) in Sunnyvale, Calif.

Figure 7:
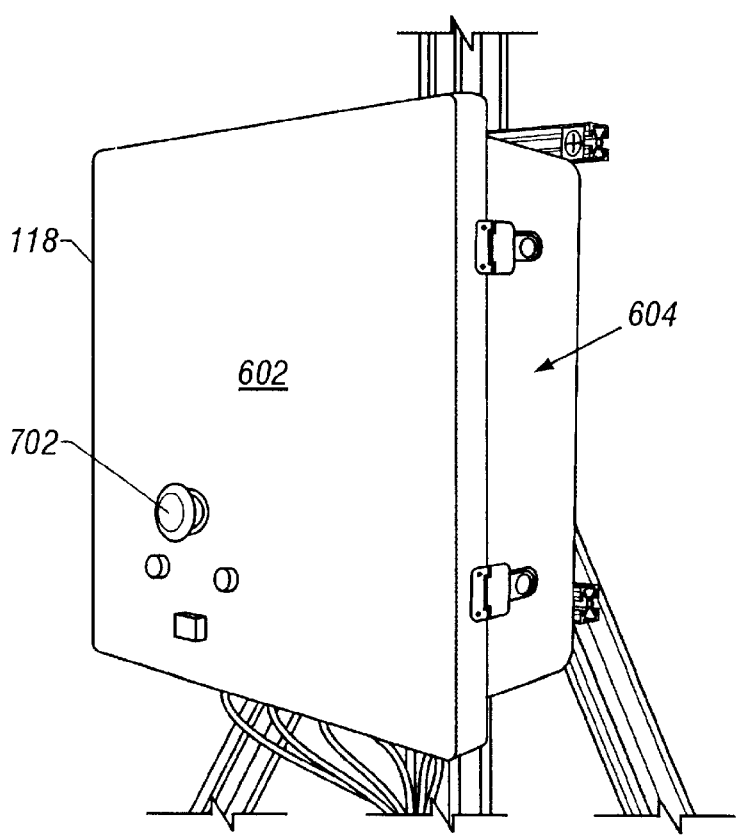
FIG. 7 is an exterior view of a control box of a FOUP hoist jig.

FIGS. 7 and 8, including FIGS. 8A, 8B, and 8C, illustrate that the DC power supply 618 and control circuitry such as the motor controller 614, counter 616, motor driver 612, and time-delay relay 606 as well as a circuit breaker 608 and terminal block 610, are housed within a housing box 118. The housing box 118 includes a front cover 602 and a housing body 604. The housing box 118 may be mounted at any convenient location. In a preferred embodiment, the housing box is mounted to the frame 101 (FIG. 1).

Reference is made to FIGS. 1, 5, 8A, 9, 11A and 11B in further discussing the operation of the hoist jig 100. In an initial phase 1100 of operation, the FOUP units 110a, 110b are moved to a home position wherein one FOUP 110 is at the top of its guide rails 206 and the other FOUP is positioned at the bottom of its guide rails 206. To initiate this initial phase, a home position command 1102 is received by the motor 121 in operation 1104. The user issues the home position command 1102 using the push-button interface 622. Subsequent to receiving the home position command 1120, the motor 121 begins to slowly rotate unless the home position sensor 902 has been triggered. If the home position sensor 902 has not been triggered, the motor 121 rotates slowly in operation 1108 until the home position sensor 902 is triggered. The slow rotation of the motor 121 causes the drive shaft 804 to rotate, causing the chain 204 to move vertically, which in turn causes the FOUP units 110a, 1110b to move into home position. When the FOUP units 110a, 110b reach home position, the home position sensor 902 is triggered. When motor 121 detects, in operation 1106, that the home position sensor 902 has been triggered, the motor 121 stops rotating in operation 1110.

Figure 11B:
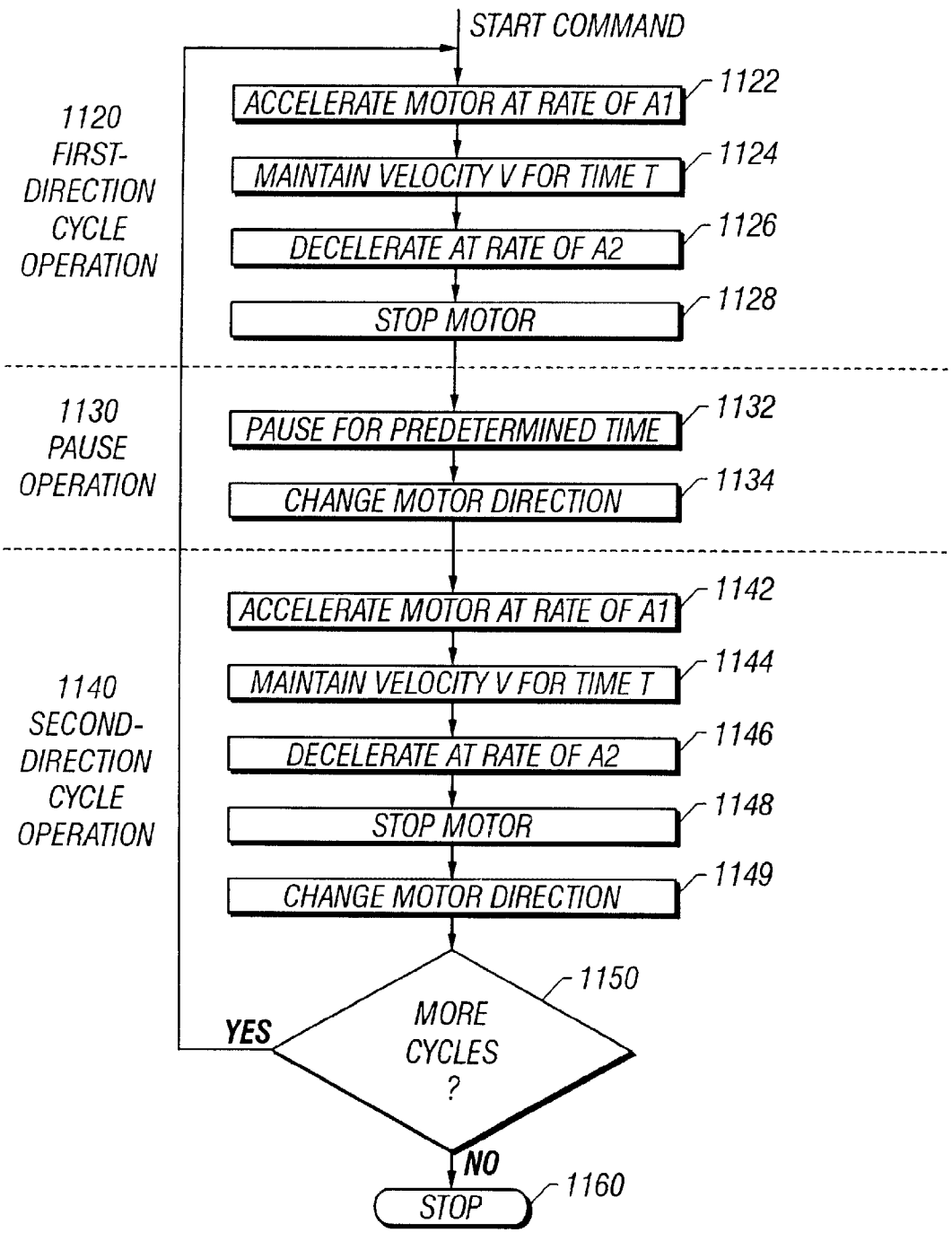
FIG. 11B is a flow chart illustrating first and second cycle-direction phases of a method of performing cycle testing using a FOUP hoist jig.

FIG. 11B illustrates that, once the FOUP units 110a, 110b have attained home position, they are ready for cycle testing. A cycle includes a first-direction cycle operation 1120, a pause operation 1130, and a second-direction operation 1140. These operations 1120, 1130, and 1140 are repeated for a predetermined number of cycles. During the first-direction cycle operation 1120, the motor 121 rotatingly accelerates in operation 1122. This accelerating rotation of the motor 121 rotates the drive shaft 804 and, accordingly, vertically moves the chain 204. This movement causes the FOUP units 110a, 110b to accelerate from their home position toward the opposite position (i.e., top FOUP moves down and bottom FOUP moves up). The acceleration in operation 1122 occurs at a rate of a1 until the FOUP units 110a, 110b reach a velocity of v. In operation 1124, the velocity of the FOUP units 110a, 110b is held constant at velocity v for a period of time t. After the period of time t has expired, the motor 121 decelerates in operation 1126 at a rate of a2 until the motor 121, (and, accordingly, the FOUP units 110a, 110b) comes to a stop in operation 1128. When the motor comes to a stop, the first-direction cycle operation 1120 has terminated.

After the first-direction cycle operation 1120 has terminated, a pause operation 1130 occurs. During the pause operation 1130, a time delay relay 606 causes the motor 121 to pause for a predetermined span of time in operation 1132. During that time, the clockwise/counterclockwise (CW/CCW+, CW/CCW−) input to the motor is toggled in operation 1134. Accordingly, the rotational direction of the motor 121 during the second-direction cycle operation 1140 will be the opposite of the direction of the first-direction cycle operation 1120.

During the second-direction cycle operation 1140, the motor 121 accelerates (going in the opposite direction now) in operation 1142, and, accordingly, the FOUP units 110*a*, 110*b* move back toward their original home position at a rate of a1 until the desired velocity of v is reached. In operation 1144, the velocity is held constant at v for time t. In operation 1146, the motor slows down at a rate of a2, causing the FOUP units 110*a*, 110*b* to slow in turn, until the FOUP units 110*a*, 110*b* come to a stop in operation 1148.

In operation 1149, the motor direction is reversed in case additional cycles are required.

If additional cycles are required, operation returns to the first-direction cycle operation 1120. Otherwise, cycle testing is complete and the motor remains idle 1160.

According to the foregoing method, FOUP units 110*a*, 110*b* are cycle tested by the hoist jig 100. Input values are set in order to emulate forces applied by a particular material handling system such as a selected OHT system. For instance, in a least one embodiment an OHT system is emulated by setting a1 to a value of 2.0 meters/second$^2$, setting v to a value of 1 meter/second, setting t to a value of 1 second, and setting a2 to a value of −2.0 meters/second$^2$. Of course, such values can be modified to emulate other material handling systems. The inventors have observed that, with the settings indicated herein, a full cycle takes approximately six seconds to complete.

FIG. 10 illustrates a wafer adapter 1000 that may be employed within a 300 mm FOUP 110 to retain 150 mm wafers. The wafer adapter 1000 is fashioned to retain a 150 mm wafer 1010 via holding pins 1012*a*, 1012*b*, 1210*c*. The wafer adapter 1000 is configured of a size and shape to be retained within a FOUP 110. When 150 mm wafers are retained within a FOUP 110 via the wafer adapter 1000, the sealing integrity of the FOUP 110 against a "bellows effect" can be performed on 150 mm wafers. This ability is useful, for instance, when the hoist jig is used to test the relative benefits of various FOUPs when a fab is considering moving from a 150 mm to a 300 mm wafer manufacturing scheme. In such case, exemplar FOUPs may be tested without the need to obtain relatively more expensive 300 mm wafers, as readily available 150 mm wafers may used with the aid of the wafer adapter 1000.

ALTERNATIVE EMBODIMENTS

While particular embodiments of the present invention have been shown and described, it will be recognized to those skilled in the art that, based upon the teachings herein, further changes and modifications may be made without departing from this invention and its broader aspects and, thus, the appended claims are to encompass within their scope all such changes and modifications as are within the true spirit and scope of the invention.

For instance, the hoist jig 100 may be used with any wafer retainer device and need not necessarily be limited to FOUP units.

We claim:

1. A hoist jig, comprising:
    a vertically upright center member having a first surface and a second surface;
    a base coupled to the center member;
    a first support arm coupled in a vertically slideable relationship to the first surface of the center member, the first support arm being configured to receive a first wafer storage container;
    a second support arm coupled in a vertically slideable relationship to the second surface of the center member, the second support arm being configured to receive a second wafer storage container; and
    a cycle mechanism that is operable to cycle the first wafer storage container and the second wafer storage container in a vertical up-and-down motion;
        wherein the cycle mechanism is further operable to maintain the first wafer storage container and the second wafer storage container in a counterbalanced relationship with each other; and
        wherein the cycle mechanism includes a motor.
2. The hoist jig recited in claim 1, wherein:
    the first wafer container is a front opening unified pod.
3. The hoist jig recited in claim 1, wherein
    the second wafer container is a front opening unified pod.
4. The hoist jig recited in claim 1, wherein:
    the center member is of a height sufficient to simulate the vertical forces exerted by a selected automated material handling system.
5. The hoist jig recited in claim 1, further comprising:
    a pillow block coupled between the first support arm and the center member, the pillow block being coupled in a vertically slideable relationship to a guide rail having a base end, the guide rail being coupled to the first surface of the center member.
6. The hoist jig recited in claim 1, further comprising:
    a pillow block coupled between the second support arm and the center member, the pillow block being coupled in a vertically slideable relationship to a guide rail, the guide rail being coupled to the second surface of the center member.
7. The hoist jig recited in claim 1, wherein:
    the cycle mechanism further comprises a drive shaft.
8. The hoist jig recited in claim 1, wherein
    the cycle mechanism further comprises a chain coupled to a sprocket wheel.
9. The hoist jig recited in claim 5, further comprising:
    a limit switch coupled to base end of the guide rail.
10. The hoist jig recited in claim 1, further comprising:
    a motor controller coupled to the motor, wherein the motor controller is operable to control the speed of the motor.
11. The hoist jig recited in claim 1, further comprising:
    a motor controller coupled to the motor, wherein the motor controller is operable to control the spin direction of the motor.
12. A method of testing two wafer containers simultaneously, comprising:
    coupling a first wafer container to a first support arm, wherein the first support arm is coupled to a first surface of a center member;
    coupling a second wafer container to a second support arm, wherein the second support arm is coupled to a second surface of the center member;

maintaining the first wafer container and the second wafer container in a counterbalanced relationship to each other; and cycling the first wafer container and the second wafer container in a vertical up-and-down motion at a speed that simulates the vertical forces exerted by a selected automated material handling system.

13. The method recited in claim 12, further comprising:
bringing the first wafer container to a home position.

14. The method recited in claim 12, further comprising:
bringing the second wafer container to a home position.

15. The method recited in claim 12, wherein:

cycling the first wafer container and the second wafer container further comprises operating a motor at a predetermined rate of acceleration a1 until a predetermined velocity v is reached.

16. The method recited in claim 15, wherein:

cycling the first wafer container and the second wafer container further comprises operating the motor at the predetermined velocity v for a predetermined time t.

17. The method recited in claim 16, wherein:

cycling the first wafer container and the second wafer container further comprises operating the motor at a predetermined rate of deceleration a2.

18. The method recited in claim 17, wherein cycling the first wafer container and the second wafer container further comprises:

changing direction of rotation of the motor; and performing a second-direction cycle operation.

19. The method recited in claim 12, further comprising:

cycling the first wafer container and the second wafer container further comprises performing a pause operation between a first-direction cycle operation and a second-direction cycle operation.

20. A hoist jig, comprising:

means for coupling a first wafer container to a chain;

means for coupling a second wafer container to a second surface of a chain;

means for maintaining the first wafer container and the second wafer container in a counterbalanced relationship to each other; and means for repeatedly cycling the first wafer container and the second wafer container in a vertical up-and-down motion.

21. The hoist jig recited in claim 20, wherein:

means for repeatedly cycling the first wafer container and the second wafer container further comprises means for vertically moving the chain at a selected velocity.

22. The hoist jig recited in claim 21, further comprising:

means for determining the selected velocity.

\* \* \* \* \*